US007183805B2

(12) United States Patent
Wang et al.

(10) Patent No.: US 7,183,805 B2
(45) Date of Patent: Feb. 27, 2007

(54) METHOD AND APPARATUS FOR MULTI-MODE DRIVER

(75) Inventors: Yueyong Wang, Sunnyvale, CA (US);
Barry W. Daly, Sunnyvale, CA (US);
Nhat M. Nguyen, San Jose, CA (US);
Yohan U. Frans, Palo Alto, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/385,234

(22) Filed: Mar. 20, 2006

(65) Prior Publication Data

US 2006/0158223 A1 Jul. 20, 2006

Related U.S. Application Data

(62) Division of application No. 10/456,303, filed on Jun. 6, 2003, now Pat. No. 7,061,273.

(51) Int. Cl.
*H03K 19/094* (2006.01)
(52) U.S. Cl. .......................................... 326/86; 326/83
(58) Field of Classification Search .................. 326/86, 326/112, 115, 127, 83, 87; 327/65, 362
See application file for complete search history.

(56) References Cited

U.S. PATENT DOCUMENTS

| 6,307,401 B1 | 10/2001 | Bridgewater, Jr. | |
|---|---|---|---|
| 6,433,579 B1 | 8/2002 | Wang et al. | |
| 6,437,599 B1 | 8/2002 | Groen | |
| 6,518,797 B2 * | 2/2003 | Yang | 326/127 |
| 6,590,422 B1 * | 7/2003 | Dillon | 326/86 |
| 6,664,814 B1 | 12/2003 | Evans et al. | |
| 6,664,853 B1 | 12/2003 | Sun et al. | |
| 6,731,135 B2 * | 5/2004 | Brunolli | 326/83 |
| 6,847,232 B2 * | 1/2005 | Tinsley et al. | 326/84 |

OTHER PUBLICATIONS

Boni, et al., "LVDS I/O Interface for Gb/s-per-Pin Operation in 0.35-um CMOS," Journal of Solid-State Circuits, vol. 36, No. 4, Apr. 2001, pp. 706-711.
Microprocessor and Microcomputer Standards Committee of the IEEE Computer Society, "IEEE Standard for Low-Voltage Differential Signals (LVDS) for Scalable Coherent Interface (SCI)," IEEE Std 1596.3-1996, pp. i-v and 1-30, no month.

* cited by examiner

*Primary Examiner*—James Cho
(74) *Attorney, Agent, or Firm*—Morgan, Lewis & Bockius LLP

(57) ABSTRACT

Multi-mode signal drivers with a single output circuit that may be controlled using a mode select input and that may include a common mode (CM) voltage compensation mechanism are described. In a first exemplary implementation, a multi-mode output driver is adapted to drive signals from a single output circuit according to at least two modes, such as a current mode logic (CML) signaling mode and a low voltage differential signaling (LVDS) mode. In a second exemplary implementation, a circuit comprises a quasi-LVDS output driver in which a differential amplifier circuit is connected in series with an adjustable resistive element and a programmable current source. In a third exemplary implementation, a CM voltage of an output driver circuit changes with changes to a programmable bias current. To compensate, a feedback mechanism provides a compensation signal to a variable resistive element of the output driver circuit to maintain a desired CM voltage.

24 Claims, 11 Drawing Sheets

METHOD AND APPARATUS FOR MULTI-MODE DRIVER

CROSS-REFERENCE TO RELATED APPLICATIONS

This application is a division of, and hereby incorporates by reference, U.S. patent application Ser. No. 10/456,303, filed Jun. 6, 2003, which is now U.S. Pat. No. 7,061,273.

TECHNICAL FIELD

This disclosure relates in general to the field of signal drivers, and in particular, by way of example but not limitation, to implementing a multi-mode signal driver with a single output circuit that may be controlled using a mode input.

BACKGROUND

Electronic signaling within and between integrated circuits (ICs) is accomplished using many different formats, standards, and approaches. Each of these electronic signaling types may be based on and/or reflect a voltage range or swings thereof, an absolute current or changes thereto, a signaling speed or frequency modulation, a combination thereof, and so forth. The various circuits that are used to implement such different electronic signaling types are equally diverse.

Two examples of such diverse circuit types for implementing the different electronic signaling types are (i) current mode logic (CML) circuitry and (ii) low voltage differential signaling (LVDS) circuitry. These two circuit types may be employed as signal output drivers.

FIG. 1 illustrates a conventional current mode logic (CML) type output driver. The conventional CML type output driver is shown as part of a transmitter (Tx). The Tx communicates with a receiver (Rx) over a channel. More specifically, the Tx is in communication with the Rx over the channel via an alternating current (AC)-coupling. This AC-coupling is represented in the channel by the capacitive elements 130 and 135. Capacitive elements 130 and 135 are illustrated as capacitors in FIG. 1.

The CML output driver of the Tx includes two inputs: a negative Tx output circuit input (TOCI (N)) and a positive Tx output circuit input (TOCI (P)). The CML output driver also includes two outputs: positive transmitter output (TP) and negative transmitter output (TN). The Rx includes two inputs: positive receiver input (RP) and negative receiver input (RN).

On the "left" side of the CML output driver, a resistive element 105 is connected in series with a transistor 115 between a supply or high-valued voltage $V_{TT}$ and a current bias 125. Current bias 125 is also coupled to a common potential of the circuit and/or system. Resistive element 105 is illustrated as a resistor, transistor 115 is illustrated as a negative-channel metal oxide semiconductor (NMOS) transistor, and current bias 125 is also illustrated as an NMOS transistor. The current bias is applied by changing or setting the voltage level at the gate terminal of transistor/current bias 125. The TOCI (N) is located at the gate of transistor 115, and the TP is located at a node between resistive element 105 and transistor 115.

On the "right" side of the CML output driver and in parallel with the "left" side, a resistive element 110 is connected in series with a transistor 120 between voltage $V_{TT}$ and current bias 125. Resistive element 110 is illustrated as a resistor, and transistor 120 is illustrated as an NMOS transistor. The TOCI (P) is located at the gate of transistor 120, and the TN is located at a node between resistive element 110 and transistor 120. Differentially-encoded information is applied to the CML output driver at TOCI (N) and TOCI (P).

The Tx at nodes TP and TN is connected across the channel via capacitive elements 130 and 135 to the Rx at inputs/nodes RP and RN, respectively. The Rx is capable of receiving signals, including differentially encoded signals, of a CML type from the CML output driver of the Tx across the channel at nodes RP an RN. A resistive element 140 is connected across nodes RP an RN. Resistive element 140 is illustrated as a resistor.

In the Rx, two resistive elements 145 and 155 are connected in series between voltage $V_{TT}$ and a common potential. Two other resistive elements 150 and 160 are also connected in series between voltage $V_{TT}$ and the common potential. Each of resistive elements 145, 150, 155, and 160 is illustrated as a resistor. Node RP is located between resistive elements 145 and 155. Node RN is located between resistive elements 150 and 160. Node RP is connected to a first input of a differential amplifier 165, and node RN is connected to a second input of differential amplifier 165. Differential amplifier 165 recovers the differentially-encoded information and provides the information at its output.

In operation, the current established by current bias 125 determines the voltage drop across resistive elements 105 and 110. Whether current is flowing across resistive elements 105 and 110 is determined by whether transistors 115 and 120, respectively, are turned on to thereby permit the current established by current bias 125 to flow through the "left" or "right" half of the CML output driver.

When TOCI (N) is at a high voltage, transistor 115 is on and current is flowing across resistive element 105 to drop the voltage seen at node TP. When TOCI (N) is high, TOCI (P) is at a low voltage and transistor 120 is therefore off. When transistor 120 is off, current is not flowing across resistive element 110, and the voltage at node TN is high. These voltage levels at nodes TP and TN are transmitted across the channel to be sensed at nodes RP and RN, respectively, of the Rx and to be interpreted at power amplifier 165. The CML type output driver of the Tx of FIG. 1 operates in an inverse process when TOCI (N) is at a low voltage and TOCI (P) is at a high voltage.

FIG. 2 illustrates a conventional low voltage differential signaling (LVDS) type output driver. The conventional LVDS type output driver is shown as part of a Tx. Although not illustrated in FIG. 2, the Tx may communicate with a Rx over a channel as shown in FIG. 1. However, for typical LVDS type output drivers, the Tx is in communication with the Rx via a direct current (DC)-coupling. Such a DC-coupling between the Tx and the Rx creates a linkage between the common mode (CM) voltage of the Tx and the CM voltage of the Rx. Consequently, the CM voltage of the Tx is usually set and maintained in accordance with the requirements or preferences of the Rx.

The LVDS output driver of the Tx includes two outputs: node TP and node TN. The values of these outputs are determined by the opened and closed positioning of a set of switches, as are described operationally below.

For the LVDS output driver, a collection of switches and resistive elements are connected in series between first and second ideal current sources that are used as push/pull current sources. These current sources may be implemented as one or more transistors. The collection of switches and resistive elements, along with the first and second current sources, are connected in series between a supply or high-valued voltage $V_{TT}$ and a common potential.

The collection of switches and resistive elements includes four switches 215, 220, 225, and 230 and two resistive elements 205 and 210. The two resistive elements 205 and 210 are illustrated as two resistors in FIG. 2. Switch SP 215 is connected in series with switch SN 225 between the two current sources. In parallel with switch SP 215 and switch SN 225, switch SN 220 is connected in series with switch SP 230 between the two current sources.

Node TP is located between switch SP 215 and switch SN 225, and node TN is located between switch SN 220 and switch SP 230. Resistive element 205 is connected in series with resistive element 210. Resistive element 205 is coupled to node TP, and resistive element 210 is coupled to node TN.

During operation of the LVDS output driver, two switch configurations may be implemented as indicated by the two different directions of the arrows. In a first switch configuration, switch SP 215 and switch SP 230 are closed while switch SN 225 and switch SN 220 are open. Consequently, node TP is set to be voltage high, and node TN is set to be voltage low as current flows from node TP to node TN across resistors 205 and 210. In a second switch configuration, on the other hand, switch SN 225 and switch SN 220 are in a closed position while switch SP 215 and switch SP 230 are in an open position. Consequently for this second switch configuration, node TP is set to be voltage low, and node TN is set to be voltage high.

In the first switch configuration, current flows through closed switch SP 215, through resistive elements 205 and 210, and through closed switch SP 230. Because of the voltage drop across resistive elements 205 and 210, node TP may be (e.g., depending on possible voltage drops across the two current sources) approximately equal to voltage $V_{TT}$ while node TN may be approximately equal to $V_{TT}$ minus the product of the current and the sum of the resistance values of resistive elements 205 and 210. In the second switch configuration, current flows through closed switch SN 220, through resistive elements 210 and 205, and through closed switch SN 225. Because of the voltage drop across resistive elements 210 and 205, node TN may be approximately equal to voltage $V_{TT}$ while node TP may be approximately equal to $V_{TT}$ minus the product of the current and the sum of the resistance values of resistive elements 210 and 205.

In other words, for node TP to be voltage high and node TN to be voltage low, switches SP 215 and 230 are closed while switches SN 220 and 225 are open. For node TN to be voltage high and node TP to be voltage low, on the other hand, switches SN 220 and 225 are closed while switches SP 215 and 230 are open. The CM of the LVDS output driver of FIG. 2 corresponds to the voltage potential between resistive element 205 and resistive element 210. Notably, this CM remains relatively constant.

There is no existing approach for combining a CML output driver and an LVDS output driver. Accordingly, there is a need for methods and apparatuses for implementing a multi-mode driver, including schemes and techniques that enable such a multi-mode driver to reproduce respective characteristics of the different drivers for the respective individual modes.

BRIEF DESCRIPTION OF THE DRAWINGS

In the Drawings, like numerals are used for like and/or corresponding features, aspects, and components of the various FIGS. 1–11.

DETAILED DESCRIPTION

Figure 3:
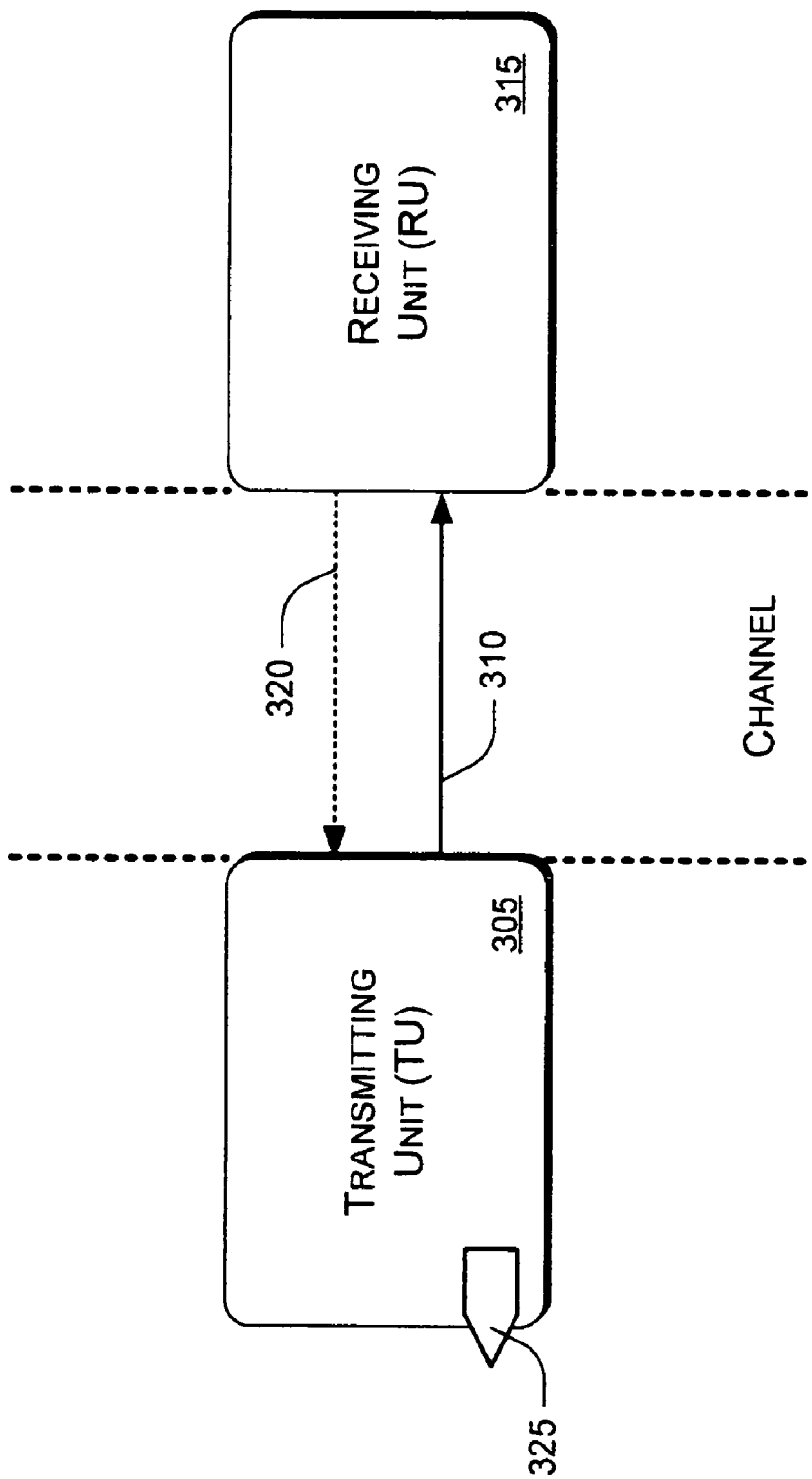
FIG. 3 is a block diagram that illustrates signaling across a channel between an exemplary transmitting unit (TU) and an exemplary receiving unit (RU).

FIG. 3 is a block diagram that illustrates signaling across a channel between exemplary electronic units. The exemplary electronic units include a transmitting unit (TU) 305 and a receiving unit (RU) 315. TU 305 sends a signal 310 to RU 315 across the illustrated channel. Although only a single signal 310 is shown being transmitted from TU 305 to RU 315, in many cases there may be multiple signals transmitted from TU 305 to RU 315 using one or more output drivers. Additionally, one or more signals may be transmitted from RU 315 to TU 305, as indicated by the dashed arrow representing optional signal(s) 320.

The TU 305 may comprise a transmitter, a circuit, a portion of a circuit, an IC chip, a printed circuit board (PCB), an electronic subsystem, a computer, and so forth. Similarly, RU 315 may comprise a receiver, a circuit, a portion of a circuit, an IC chip, a PCB, an electronic subsystem, a computer, and so forth. By way of example, TU 305 and RU 315 may jointly or separately comprise a memory chip, a memory module, a memory system, and so forth. More specifically, TU 305 and RU 315 may comprise a memory controller, a memory storage device, any general memory component, and so forth. TU 305 and RU 315 may be on the same IC, may be on different ICs (e.g., on a single PCB or on different PCBs), may be on separate components (e.g., separate cards, modules, etc. connected by one or more buses, etc.), may be connected by one or more backplanes, and so forth.

Although signal(s) 310 and 320 can be any general signal that is capable of communicating information, the signals are digital or analog signals in the described implementation(s). If the signals are digital, for example, they may relate to memory read/write data, control data, address data, and so forth. However, such digital signals may more generally represent the binary data of any computing system. Furthermore, signals 310 and 320 may be single-ended signals, differential signals, some combination thereof, and so forth.

The TU 305 includes a mode select input 325. Mode select input 325 is used to select which of two or more modes TU 305 is to use for transmission. In a described implementation, mode select input 325 selects between a CML driver output mode and an LVDS driver output mode. However, mode select input 325 may be used to select between or among other transmission output modes. Depending on the physical make-up of TU 305, mode select input 325 may be an I/O pin of an IC, a line into a circuit or circuit portion, an input to or a lead across a PCB, and so forth.

Figure 4:
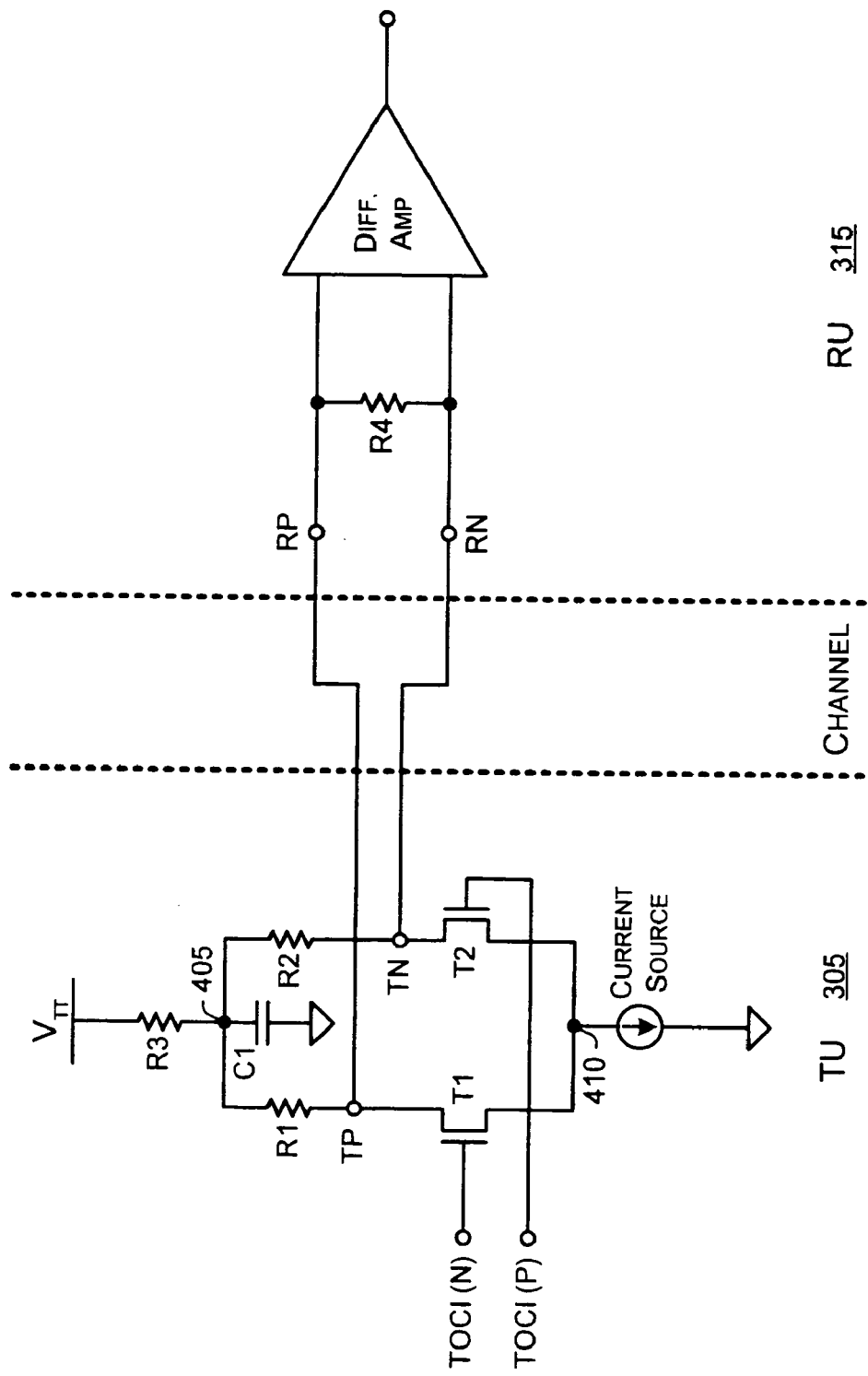
FIG. 4 illustrates a TU having an exemplary quasi-LVDS type output driver that is in communication with a RU.

FIG. 4 illustrates a TU 305 having an exemplary quasi-LVDS type output driver that is in communication with a RU 315 over a channel. As illustrated, TU 305 is in communication with RU 315 via a DC-coupled channel. The quasi-LVDS output driver of TU 305 includes two inputs: TOCI (N) and TOCI (P). The quasi-LVDS output driver also includes two outputs: one at node TP and one at node TN. RU 315 includes two inputs: one at node RP and one at node RN.

Figure 1:
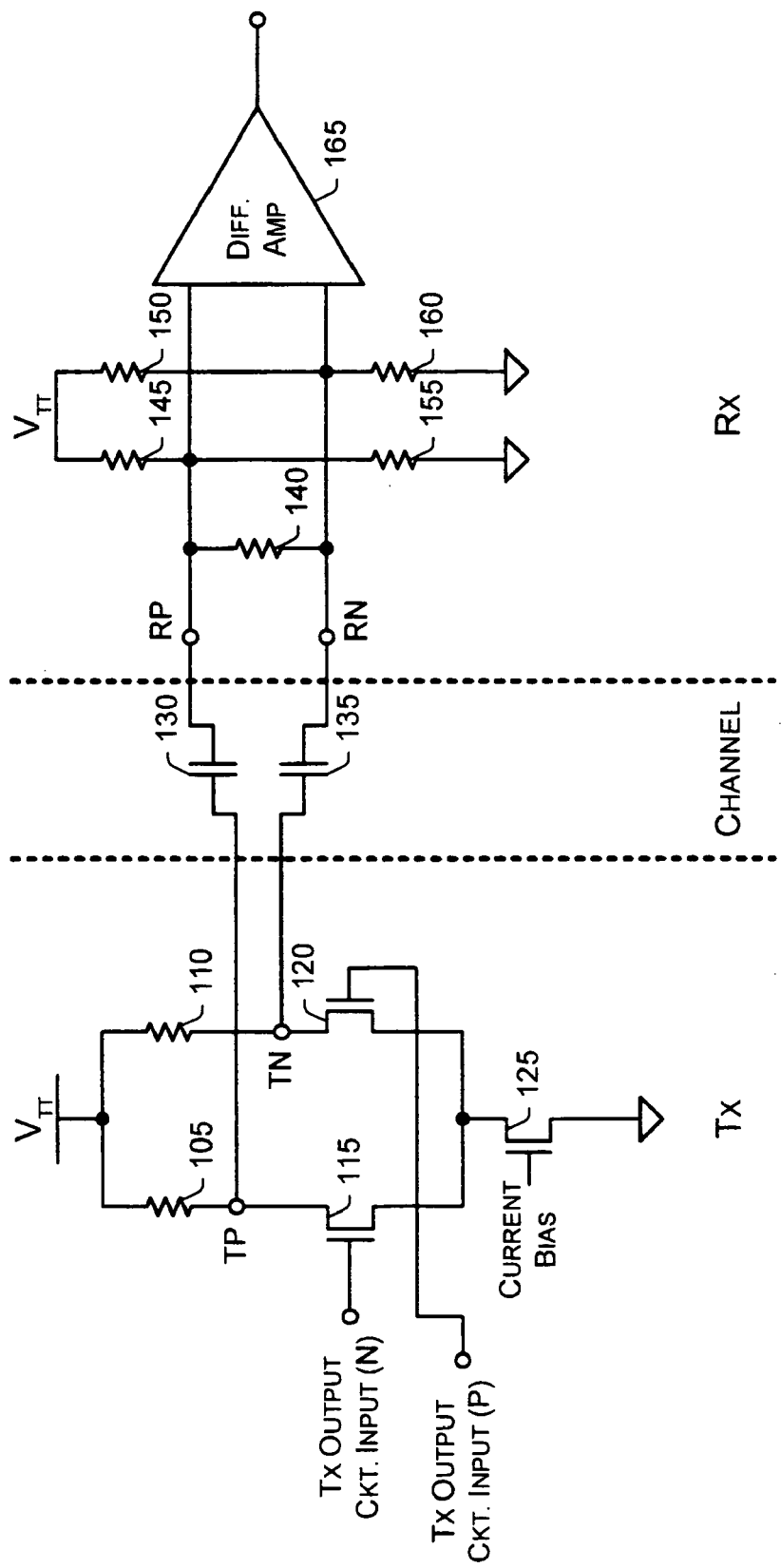
FIG. 1 illustrates a conventional current mode logic (CML) type output driver.
Figure 2:
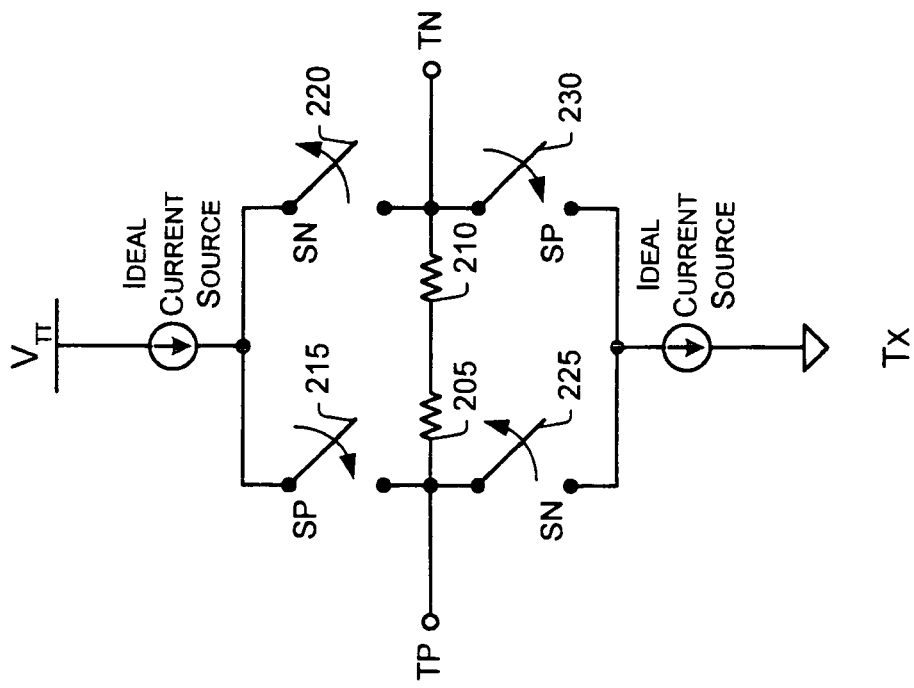
FIG. 2 illustrates a conventional low voltage differential signaling (LVDS) type output driver.

In a described implementation, the quasi-LVDS output driver of TU 305 may be operated like an LVDS output driver as described above with reference to FIG. 2. However, the output driver of TU 305 in FIG. 4 also resembles a CML output driver as described above with reference to FIG. 1 in that it includes a differential pair in which each transistor thereof is jointly coupled to a current source. Modification of the quasi-LVDS output driver of TU 305 in FIG. 4 to enable a multi-mode output driver is described further below with reference to FIG. 5 et seq.

The quasi-LVDS output driver of TU 305 of FIG. 4 includes a resistive element R3 that is connected between a supply or high-valued voltage $V_{TT}$ and a first node 405. Between node 405 and a common potential, a capacitive element C1 is connected. The common potential may be set to ground or otherwise tied into the ground. Below the differential pair, a current source is connected between a node 410 and the common potential.

A resistive element R1 is connected in series with a transistor T1, with resistive element R1 coupled to node 405 and transistor T1 coupled to node 410. A resistive element R2 is connected in series with a transistor T2, with resistive element R2 also coupled to node 405 and transistor T2 also coupled to node 410. Thus, resistive element R1 and transistor T1 are connected in parallel with resistive element R2 and transistor T2 in between nodes 405 and 410.

The inputs TOCI (N) and TOCI (P) of the quasi-LVDS output driver are connected to the gates of transistors T1 and T2. Specifically, TOCI (N) is coupled to the gate of transistor T1, and TOCI (P) is coupled to the gate of transistor T2. The outputs TP and TN of the quasi-LVDS output driver are connected in between resistive element R1 and transistor T1 and in between resistive element R2 and transistor T2, respectively. In other words, node TP is located between resistive element R1 and transistor T1, and node TN is located between resistive element R2 and transistor T2.

As described above and illustrated in FIG. 4, transistors T1 and T2 form a differential pair with loads of resistive element R1 and resistive element R2, respectively. Resistive elements R1, R2, and R3 are illustrated as resistors. Capacitive element C1 is illustrated as a capacitor, and transistors T1 and T2 are illustrated as NMOS transistors. However, the resistive elements, capacitive element, and transistors illustrated in FIG. 4, as well as those in FIGS. 5–11, may be implemented alternatively, especially depending on the process technology of the given IC. For example, resistive elements may be implemented using the linear operating mode of a positive-channel metal oxide semiconductor (PMOS) transistor.

The TU 305 communicates over the illustrated channel with RU 315 using a DC-coupling. However, other coupling means between TU 305 and RU 315 may alternatively be utilized. RU 315 includes a resistive element R4 that is connected between the inputs RP and RN. These nodes RP and RN also serve as inputs to a differential amplifier. Although RU 315 is illustrated as described here, it may alternatively be implemented by using different components and/or by connecting components differently.

In operation, the quasi-LVDS output driver of TU 305 is able to maintain a CM that is preferred by RU 315 across the DC-coupling. Adding resistive element R3 to a traditional CML output driver permits the quasi-LVDS output driver to provide a desired CM voltage at its output nodes TP and TN during differential signaling. Specifically, resistive element R3 enables a reduction in the CM voltage in order to meet the requirements or preferences of a given LVDS type RU 315. Adding capacitive element C1 between node 405 and the common potential creates an AC ground at node 405 (for implementations in which the common potential is at ground). This AC ground enables a CML type RU 315 to still see the same impedance at the output nodes TP and TN of the quasi-LVDS output driver of TU 305 when it is used as a multi-mode output driver as is described below with reference to FIG. 5 et seq.

If first information is encoded differentially, TOCI (N) is at voltage high, and TOCI (P) is at voltage low. When TOCI (N) is at voltage high at the gate of transistor T1, transistor T1 is turned on and the current of the current source flows through resistive element R3 and resistive element R1. When TOCI (N) is at voltage high, then TOCI (P) is at voltage low at the gate of transistor T2, and transistor T2 is turned off. Thus, output node TP is at voltage low, and output node TN is at voltage high. More specifically, node TP is at a voltage level that at least approximately equals voltage $V_{TT}$ minus the product of the current and the sum of the resistance values of resistive elements R1 and R3. Node TN, on the other hand, is at a voltage level that at least approximately equals voltage $V_{TT}$ minus the product of the current and the resistance value of only resistive-element R3.

If second information is encoded differentially, TOCI (N) is at voltage low, and TOCI (P) is at voltage high. When TOCI (P) is at voltage high at the gate of transistor T2, transistor T2 is turned on and the current flows through resistive element R3 and resistive element R2. When TOCI (P) is at voltage high, then TOCI (N) is at voltage low at the gate of transistor T1, and transistor T1 is turned off. Thus, output node TN is at voltage low, and output node TP is at voltage high. More specifically, node TN is at a voltage level that at least approximately equals voltage $V_{TT}$ minus the product of the current and the sum of the resistance values of resistive elements R2 and R3. Node TP, on the other hand, is at a voltage level that at least approximately equals voltage $V_{TT}$ minus the product of the current and the resistance value of only resistive element R1. Exemplary multi-mode output driver implementations that are derived from the quasi-LVDS output driver of FIG. 4, along with various CM voltage implications, are described below.

Figure 5:
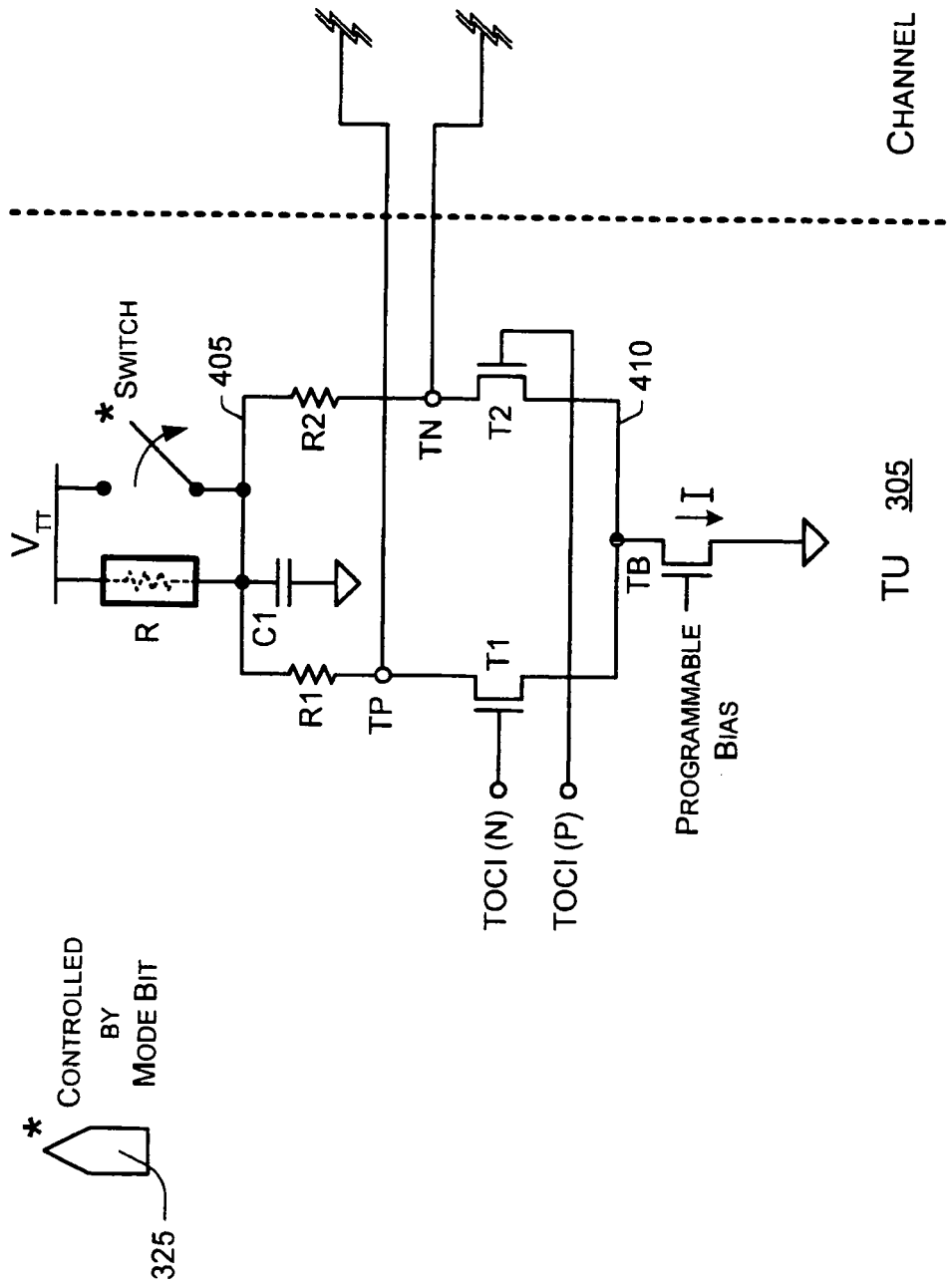
FIG. 5 illustrates a TU that has an exemplary multi-mode output driver.

FIG. 5 illustrates a TU 305 that has an exemplary multi-mode output driver. In the multi-mode output driver, a switch has been added between the voltage $V_{TT}$ and node 405. Relative to the quasi-LVDS output driver as illustrated in FIG. 4, several additional changes are present. First, resistive element R3 has been replaced with generic resistive element R. Exemplary implementations for resistive element R are described below with reference to FIGS. 6, 7, 8, et seq. Second, a programmable bias current source has replaced the ideal current source illustrated in FIG. 4. Third, mode select input 325 is included as part of TU 305. It is implemented as a mode bit that controls the switch.

Thus, as indicated by the asterisks, a mode bit input* 325 controls operation of the switch*. Specifically, mode bit input 325 causes the switch to open and close. When the switch is open, the multi-mode output driver functions like the quasi-LVDS output driver as described above with reference to FIG. 4. When closed, the switch shorts resistive element R so that the voltage of node 405 equals voltage $V_{TT}$. The closed positioning thus enables the multi-mode output driver to function like the CML output driver as described above with reference to FIG. 1. In operation, applying a first value to mode bit input 325 causes the switch to close and applying a second value to mode bit input 325 causes the switch to open. The switch may be implemented as a transmission gate, for example.

The programmable bias current source is illustrated as a transistor TB that can bias the current flowing through the differential pair T1/T2 by adjusting the voltage at the gate of an NMOS transistor. In operation, the current bias that is set through transistor TB is adjusted responsive to an input, such as mode bit input 325 or a separate input (not specifically shown in FIG. 5). In general, different output voltage swings for two or more different modes, as well as different swings within each mode, are provided by adjusting the current bias that is instituted by transistor TB. It may be desirable to increase the voltage swing, for example, to accommodate a longer channel between TU 305 and RU 315 and the concomitant greater attenuation. It is the programmable bias at the gate of transistor TB that enables different current strengths, and thus different voltage swings, to be provided through the multi-mode output driver.

As noted above, it is often preferable for the CM voltage seen by a RU 315 to be relatively constant, even with different output swings from a TU 305. Thus, for a direct coupled transmitter/receiver system, the CM voltage of TU 305 is preferably maintained constant. Unfortunately, the CM voltage of the multi-mode output driver of FIG. 5 varies with changes to the programmable current when operating like an LVDS output driver (e.g., with the switch open). The CM voltage may be determined for the quasi-LVDS output driver configuration according to the following equation:

$$V_{CM} = V_{TT} - I \cdot R - \left(\frac{I}{2}\right) \cdot (R_1 \text{ or } R_2). \quad \text{(Eqn. 1)}$$

Typically, R1 and R2 have equivalent resistance values for the differential pair outputs. One approach to remedying the CM voltage fluctuation that results from current changes is to provide different resistance values for resistive element R according to different current strengths (e.g., responsive to different programmable biases of transistor TB).

Figure 6:
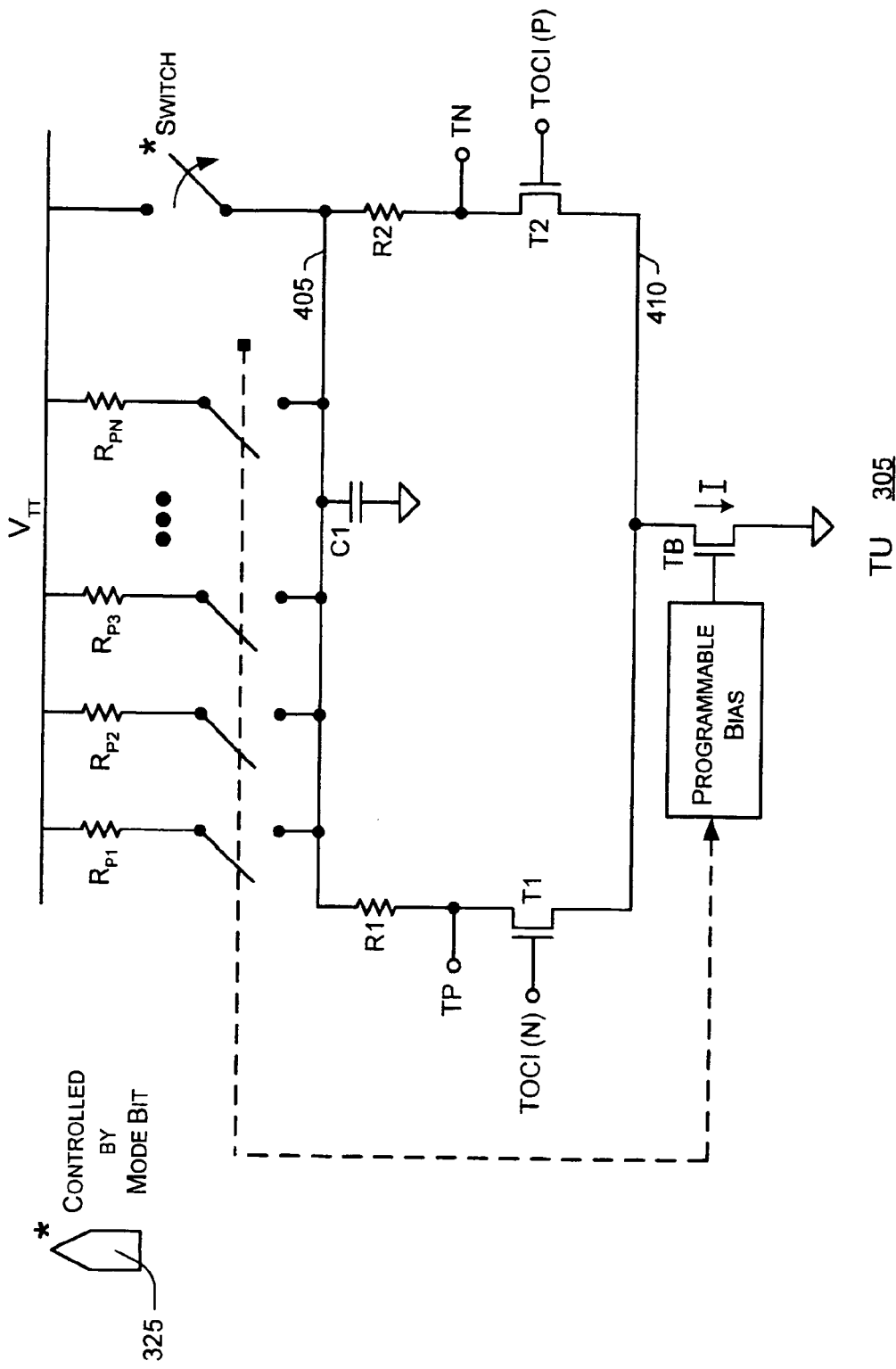
FIG. 6 is a TU having a multi-mode output driver that illustrates an exemplary multi-resistive element common mode (CM) voltage compensation approach.

FIG. 6 is a TU 305 having a multi-mode output driver that illustrates an exemplary multi-resistive element CM voltage compensation approach. The resistive element R of FIG. 5 is replaced by multiple resistive elements $R_{P1}$, $R_{P2}$, $R_{P3}$ ... $R_{PN}$ that may be programmably selected along with the programmable bias of transistor TB. Each respective resistive element $R_P$ of the multiple resistive elements $R_{P1}$ ... $R_{PN}$ is connected in series with a respective switch of multiple switches between voltage $V_{TT}$ and node 405.

To maintain a constant CM voltage, one switch of the multiple switches is closed responsive to a selected current strength. If the current strength set by transistor TB is increased, then the resistive element between voltage $V_{TT}$ and node 405 is decreased by opening a first switch that is in series with a first resistive element $R_P$ and by closing a second switch that is in series with a second, smaller resistive element $R_P$. The inverse switch manipulation process is effectuated if the current strength is decreased so as to increase the resistive element provided by the multiple resistive elements $R_{P1}$ ... $R_{PN}$. In this manner, in accordance with equation 1 above, the CM voltage of the multi-mode output driver may be maintained at a relatively constant level.

There are, unfortunately, two drawbacks to this approach. First, a coding/decoding scheme (not explicitly shown) is also implemented. Such a scheme maps the different current bias strengths to different respective switches that are in series with the multiple resistive elements $R_{P1}$ ... $R_{PN}$. Second, this approach is a process-dependent methodology.

A simpler and process-independent approach for remedying the CM voltage fluctuation that results from current changes is described below with particular reference to FIG. 8 et seq. It should be noted that the CM voltage compensation approaches as described herein may also be used with the quasi-LVDS type output driver of FIG. 4 without a multi-mode capability.

Figure 7:
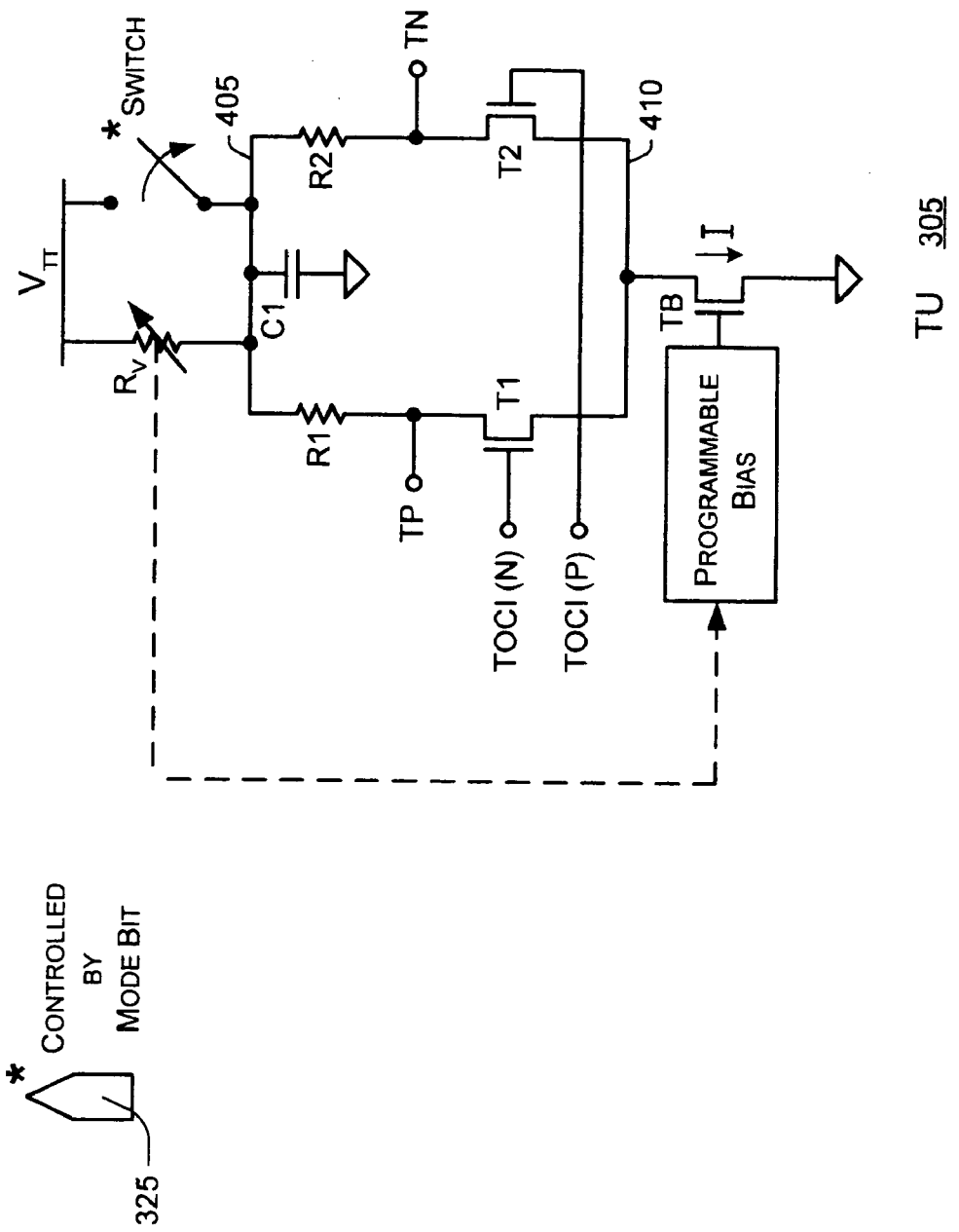
FIG. 7 is a TU having a multi-mode output driver that illustrates an exemplary variable-resistive element CM voltage compensation approach.

FIG. 7 is a TU 305 having a multi-mode output driver that illustrates an exemplary variable-resistive element CM voltage compensation approach. The resistive element R of FIG. 5 is replaced by a variable resistive element $R_V$. The resistance value of resistive element $R_V$ may be varied along with the programmable bias of transistor TB. The resistance value of resistive element $R_V$ is varied inversely with respect to changes in the current strength as biased by transistor TB in order to maintain the desired voltage drop across resistive element $R_V$ as seen at node 405.

However, this variable-resistive element approach also involves a coding/decoding scheme to link bias current strength to the variable resistance values. One means for implementing a variable resistive element is a PMOS transistor. An approach described below and illustrated in FIG. 8 utilizes a variable resistive element in the form of a PMOS transistor, but a coding/decoding scheme is avoided through the application of a feedback mechanism.

Figure 8:
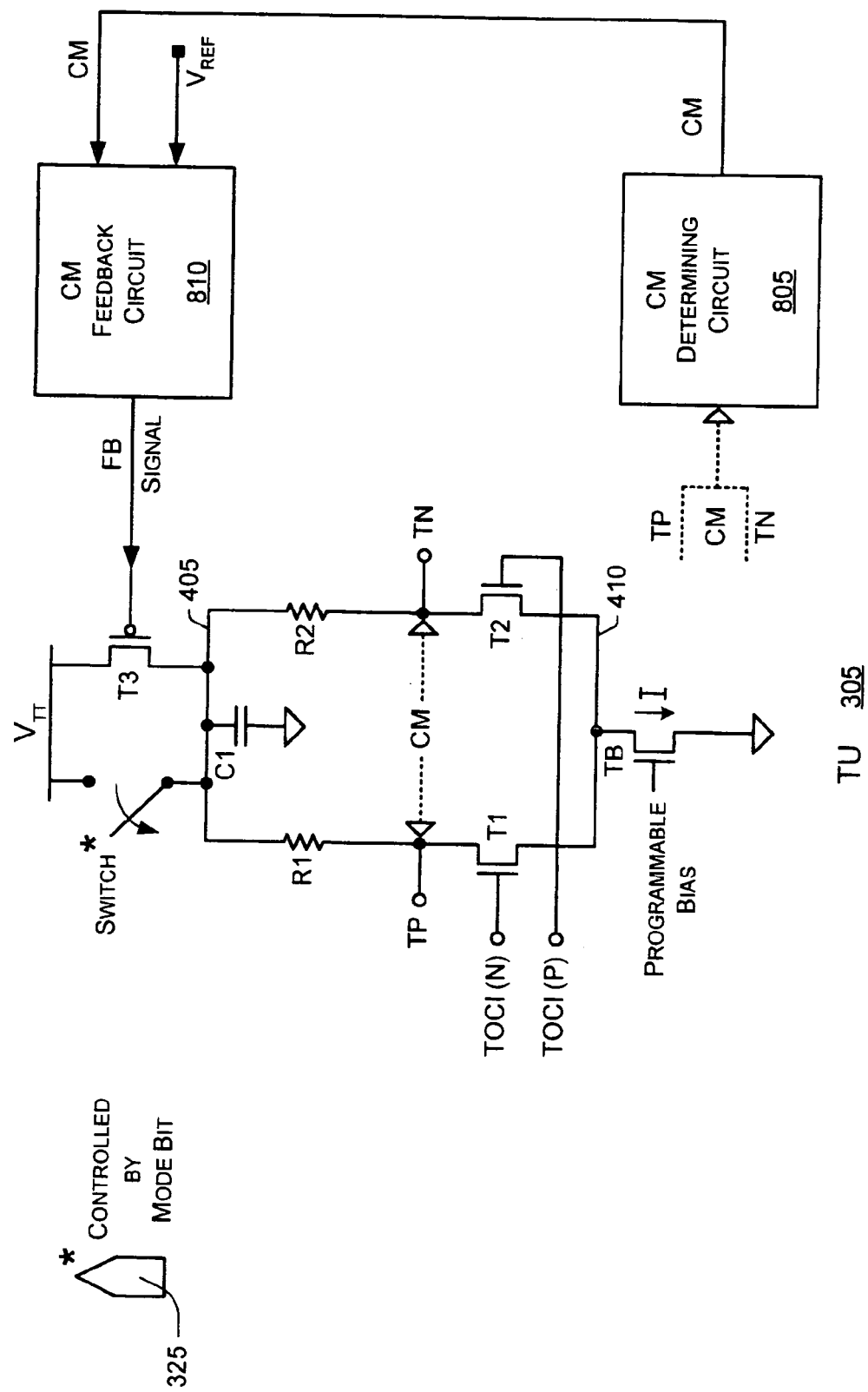
FIG. 8 is a TU having a multi-mode output driver that illustrates an exemplary variable-resistive element with feedback CM voltage compensation approach.

FIG. 8 is a TU 305 having a multi-mode output driver that illustrates an exemplary variable-resistive element with feedback CM voltage compensation approach. Specifically, a variable-resistive element that is implemented as a transistor T3 is controlled by a feedback (FB) signal. Although transistor T3 is illustrated as a PMOS transistor, other transistors types or optionally other variable resistive element components may alternatively be used.

Transistor T3 is connected between voltage $V_{TT}$ and node 405. The gate of transistor T3 receives the FB signal that can control the resistive element of transistor T3. The gate terminal thus functions as an exemplary input to control a resistance value of a transistor implementation of a variable resistive element. The resistive functionality of transistor T3 may be modeled as a resistor as long as transistor T3 is operated in the linear region of the exemplary PMOS implementation. In this approach, there need not be any explicit and direct mapping between the current of programmable bias transistor TB and the resistive element of transistor T3 as established by the FB signal. Instead, a feedback loop takes into consideration the CM voltage as seen at output nodes T1 and TN to adjust the resistive element of transistor T3 via the FB signal.

Specifically, a CM determining circuit 805 determines the CM output voltage from the differential signaling output at node TP and node TN. This determining may be effectuated relatively directly by sensing the CM voltage, relatively indirectly by replicating the CM voltage, and so forth. A CM sensing implementation is described further below with reference to FIG. 9, and a CM replicating implementation is described further below with reference to FIG. 10.

After CM determining circuit 805 determines the CM voltage as seen at output nodes TP and TN, CM determining circuit 805 provides the determined CM voltage to a CM feedback circuit 810. CM feedback circuit 810 also receives a reference voltage for comparison purposes. CM feedback circuit 810 compares the reference voltage to the received CM voltage to derive a FB signal. The FB signal is provided from CM feedback circuit 810 to the gate of transistor T3 to set the resistive element of transistor T3.

Figure 9:
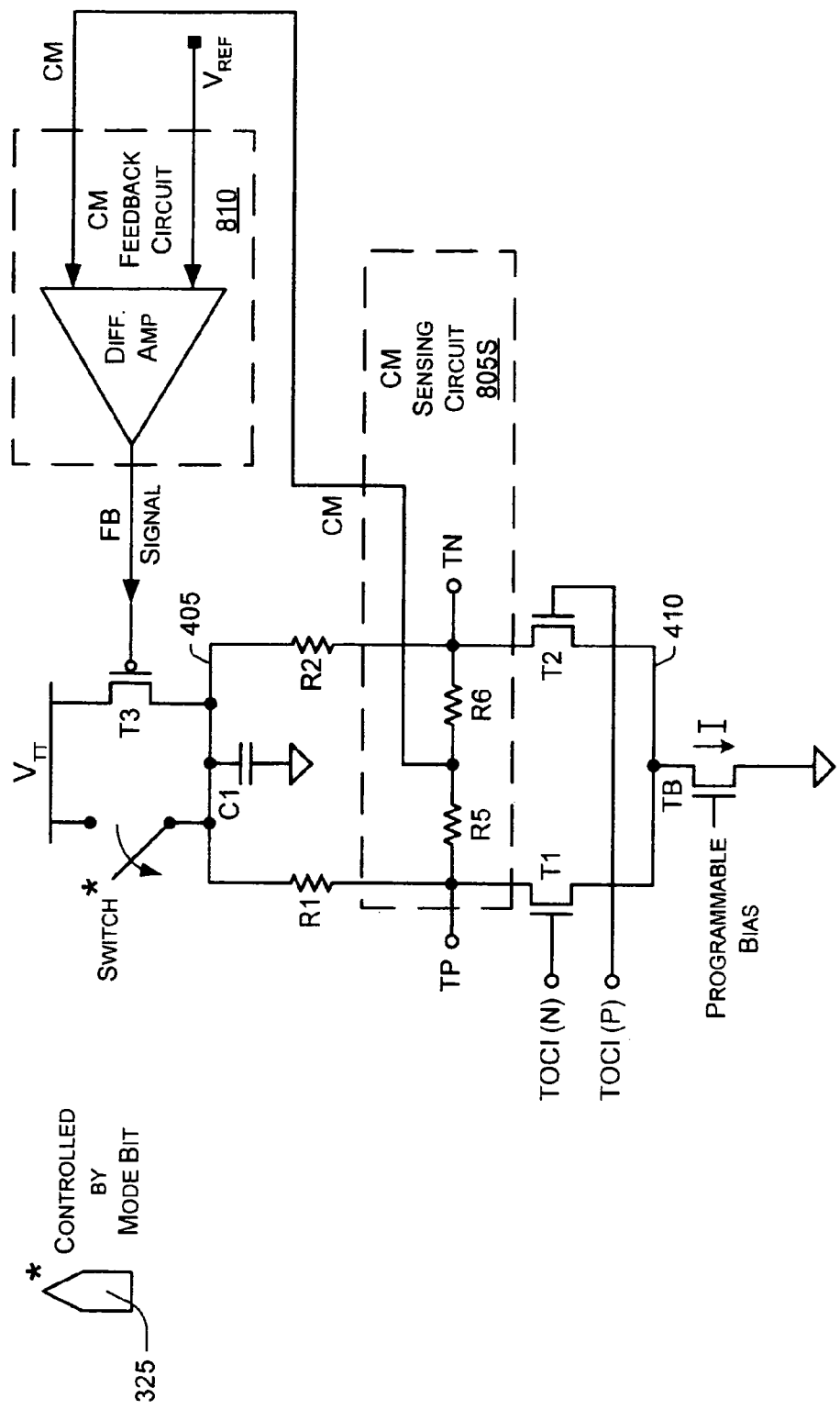
FIG. 9 is a TU having a multi-mode output driver that implements a CM voltage compensation approach using an exemplary CM sensing circuit in a feedback loop.

FIG. 9 is a TU 305 having a multi-mode output driver that implements a CM voltage compensation approach using an exemplary CM sensing circuit 805S in a feedback loop. CM sensing circuit 805S determines the CM voltage of the output nodes TP and TN by sensing it. In a described implementation, CM sensing circuit 805S includes two resistive elements R5 and R6. Resistive element R5 is connected in series with resistive element R6, with resistive element R5 coupled to node TP and resistive element R6 coupled to node TN. Although resistive elements R5 and R6 are illustrated as resistors, other types of resistive components may alternatively be used to implement resistive elements R5 and R6.

Resistive elements R5 and R6 are at least approximately equal so that the CM voltage for a differential signaling output from nodes TP and TN may be sensed at the node in between resistive elements R5 and R6. This node is labeled CM in FIG. 9. The CM voltage is provided from CM sensing circuit 805S to CM feedback circuit 810.

The CM feedback circuit 810 receives, in addition to the CM voltage, a voltage reference input. In a described implementation, this reference voltage input is set equal to the desired CM voltage for the differential signaling output at nodes TP and TN. The reference voltage may be acquired as an input signal or as a voltage that is generated internally. CM feedback circuit 810 produces the FB signal from the CM voltage and the reference voltage. This FB signal is forwarded to the gate terminal of transistor T3 so as to control the source-drain channel resistive element of transistor T3.

In a described implementation, CM feedback circuit 810 is implemented as a differential amplifier that accepts the CM voltage as a first input and the reference voltage as a second input. The differential amplifier ascertains the difference between the CM voltage and the reference voltage to produce the FB signal. The ascertained difference may be amplified or otherwise scaled if necessary to properly affect the gate terminal of transistor T3. Although CM feedback circuit 810 is illustrated as a differential amplifier, other components may alternatively be used to ascertain how much the CM voltage deviates from the selected reference voltage.

Figure 10:
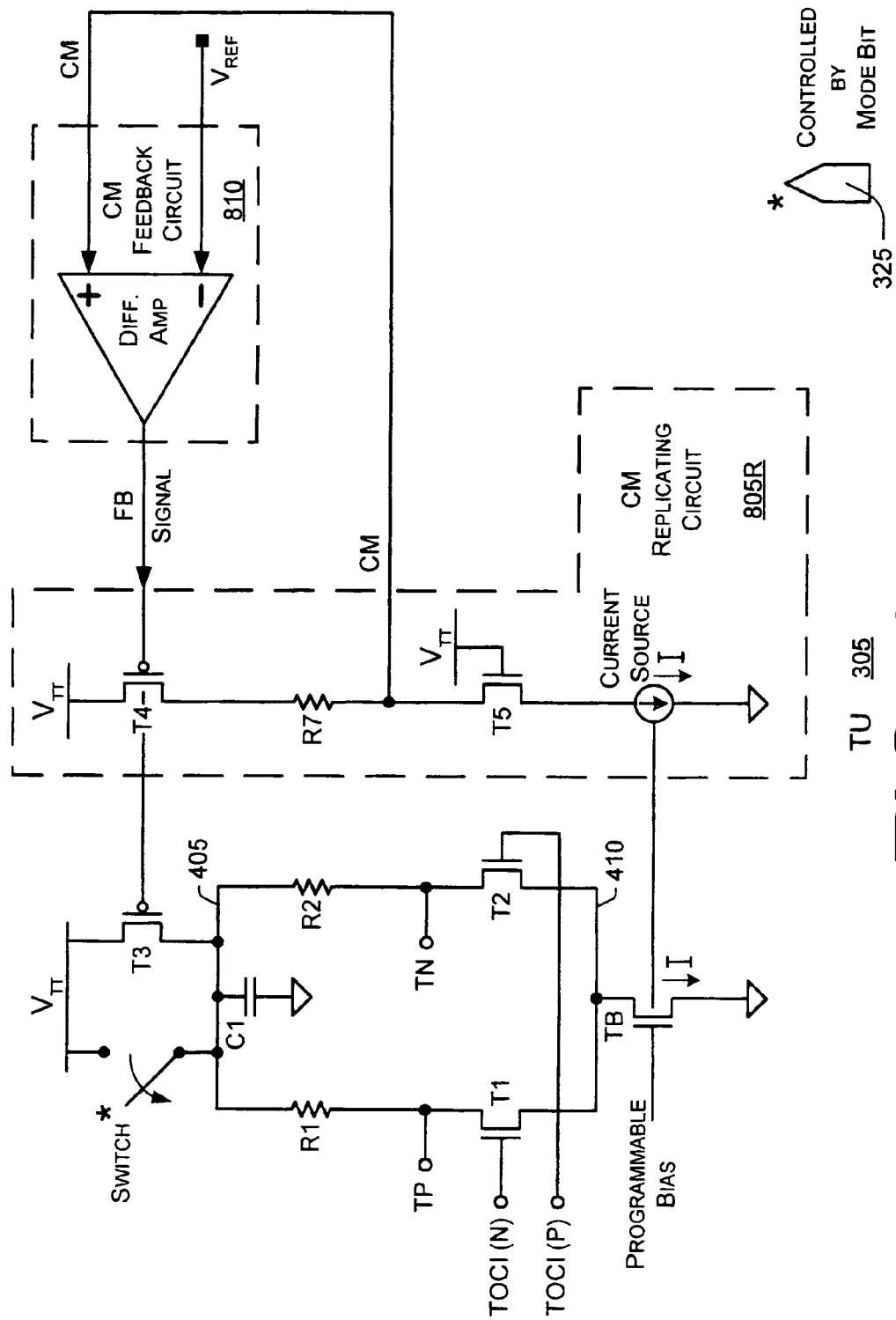
FIG. 10 is a TU having a multi-mode output driver that implements a CM voltage compensation approach using an exemplary CM replicating circuit in a feedback loop.

FIG. 10 is a TU 305 having a multi-mode output driver that implements a CM voltage compensation approach using an exemplary CM replicating circuit 805R in a feedback loop. In a described implementation, CM replicating circuit 805R effectively replicates one-half of the differential pair circuit portion as represented by transistors T1 and T2 and loading resistive elements R1 and R2. In this manner, the CM voltage at differential output nodes TP and TN is replicated for use as part of a feedback loop.

In a described implementation, the feedback loop includes CM replicating circuit 805R, CM feedback circuit 810, a CM voltage signal, and a FB signal. The feedback loop accepts as input a reference voltage and the programmable bias signal that is also provided to transistor TB. The feedback loop produces as output the FB signal that is provided to transistor T3.

Generally, responsive to the programmable bias voltage signal that establishes a current, CM replicating circuit 805R replicates the CM voltage. CM replicating circuit 805R provides the CM voltage to CM feedback circuit 810. CM feedback circuit 810 receives a reference voltage in addition to the CM voltage. The reference voltage is set equal to the desired CM voltage, which may be dictated by requirements and/or preferences of a RU 315 (not shown in FIG. 10). CM feedback circuit 810 ascertains the FB signal based on the CM voltage and the reference voltage. This FB signal is provided to CM replicating circuit 805R and the variable resistive element component as implemented by transistor T3.

Specifically, CM replicating circuit 805R includes transistors T4 and T5, resistive element R7, and an ideal current source. Transistor T4 is connected in series with resistive element R7, with transistor T4 coupled to voltage $V_{TT}$ and resistive element R7 coupled to node CM. Transistor T5 is connected in series with the current source, with transistor T5 coupled to node CM and the current source coupled to a common potential of the circuit or system. The gate of transistor T5 is also coupled to voltage $V_{TT}$ so as to turn on transistor T5 and permit the current to flow there through.

Resistive element R7 is illustrated as a resistor. Transistor T4 is illustrated as a PMOS transistor, and transistor T5 is illustrated as an NMOS transistor. However, these elements may alternatively be implemented by other components. An exemplary implementation for the current source of CM replicating circuit 805R is described below with reference to FIG. 11.

With regard to component values and/or operating characteristics, transistor T4 may be comparable or equivalent to transistor T3, resistive element R7 may be comparable or equivalent to resistive elements R1 and R2, and transistor T5 may be comparable or equivalent to transistors T1 and T2. Alternatively, the components of CM replicating circuit 805R may be scaled versions of their corresponding components, as is described further below with reference to FIG. 11.

In operation, the programmable bias applied to transistor TB is also applied to the current source of CM replicating circuit 805R. The current strength set thereby also flows through those components of CM replicating circuit 805R that are in series with the current source. Because of the circuit replication, the CM voltage at output nodes TP and TN is also present at node CM of CM replicating circuit 805R. This CM voltage is forwarded from CM replicating circuit 805R to CM feedback circuit 810.

In a described implementation, CM feedback circuit 810 is a differential amplifier that receives the CM voltage at a positive input and the reference voltage at a negative input. The reference voltage is set to the desired CM voltage for the output nodes TP and TN according to the desired high and low output voltages and the swing(s) therebetween. The feedback loop ensures that this selected CM voltage as input via the reference voltage at the differential amplifier of CM feedback circuit 810 is maintained at node CM and therefore at output nodes TP and TN. This negative feedback mechanism also automatically accounts for temperature variations because of the component and partial circuit replication.

The differential amplifier of CM feedback circuit 810 ascertains the difference between the CM voltage at node CM and the selected reference voltage. This voltage difference is output from the differential amplifier as the FB signal. The FB signal may be amplified or otherwise scaled to accommodate the specification(s) of the gate terminal for the target transistors. This FB signal is applied to the gates of both transistor T4 and transistor T3 to thereby adjust the resistive elements thereof. Adjusting the resistive element of the transistors T4 and T3 changes the voltage across them as long as the current flowing through them as biased by the current source of CM replicating circuit 805R and transistor TB, respectively, remains at least relatively constant.

With respect specifically to transistor T4 of CM replicating circuit 805R, the voltage at node CM is adjusted by changes to the FB signal. If the CM voltage at node CM is greater than the selected reference voltage, then the FB signal increases the resistive element across transistor T4 to thereby increase the voltage drop across it. The resistive element across transistor T4 is increased by increasing the voltage applied to the gate terminal of transistor T4. The increased voltage drop across transistor T4 reduces the voltage level at node CM until it is at least approximately equal to the selected reference voltage.

If, on the other hand, the CM voltage at node CM is lower than the selected reference voltage, then the FB signal decreases the resistive element across transistor T4 to thereby decrease the voltage drop across it. The resistive element across transistor T4 is decreased by decreasing the voltage applied to the gate terminal of transistor T4. The decreased voltage drop across transistor T4 increases the voltage level at node CM until it is at least approximately equal to the selected reference voltage.

This feedback mechanism therefore maintains the desired voltage level, as indicated by the selected reference voltage, at node CM. Because the FB signal is also propagated from CM feedback circuit 810 to transistor T3, the resistive element of transistor T3 is similarly adjusted (e.g., increased or decreased). This resistive element adjustment translates into a change in the voltage across transistor T3. This change to the voltage across transistor T3 favorably sets the CM voltage as seen at the output nodes TP and TN analogously to the scheme as described above with respect to node CM of CM replicating circuit 805R.

Figure 11:
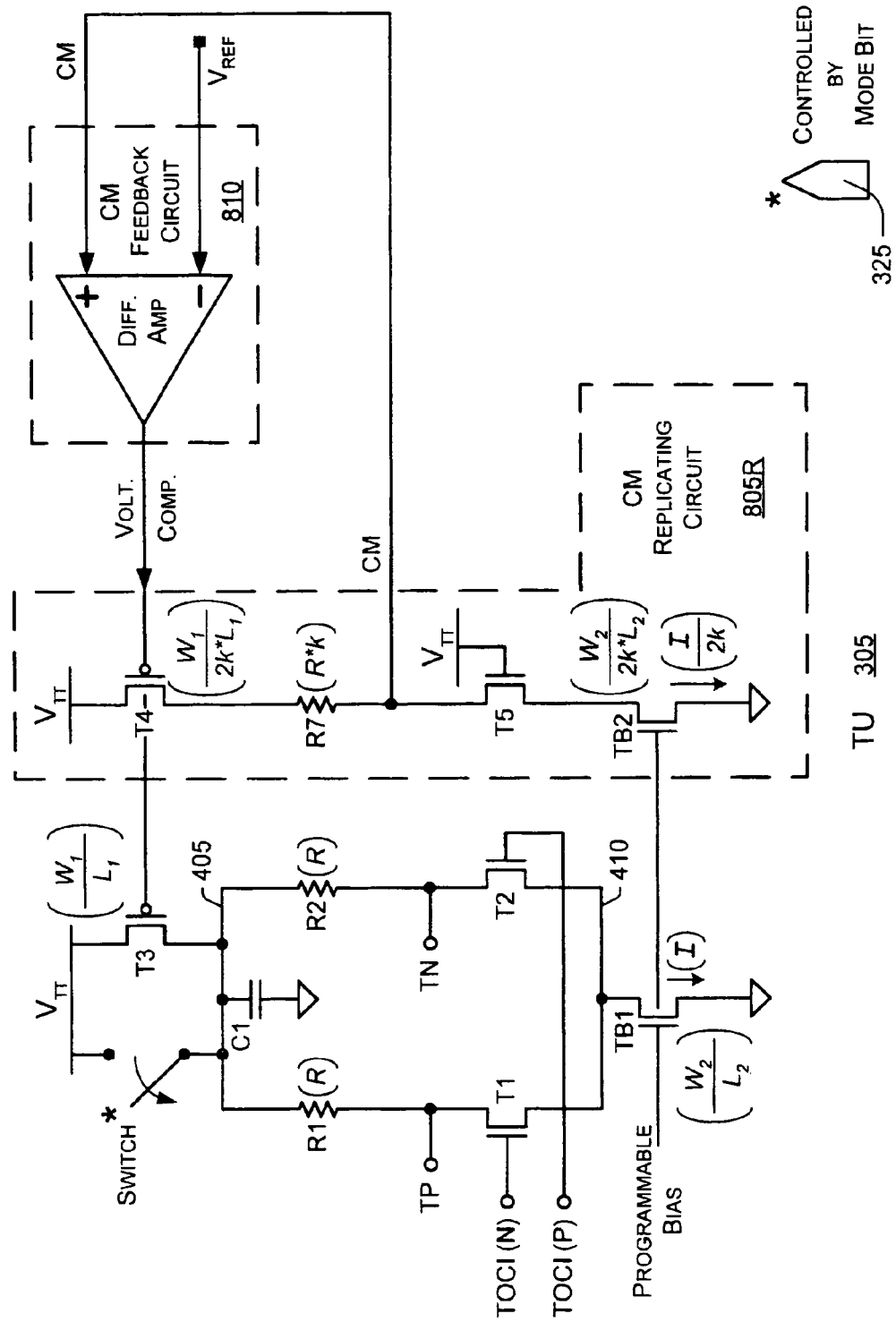
FIG. 11 is a TU having a multi-mode output driver that implements a CM voltage compensation approach using the exemplary CM replicating circuit of FIG. 10 in a feedback loop with scaled components.

FIG. 11 is a TU 305 having a multi-mode output driver that implements a CM voltage compensation approach using the exemplary CM replicating circuit 805R of FIG. 10 in a feedback loop with scaled components. Relative to FIG. 10, FIG. 11 illustrates several different exemplary features. First, the current source of CM replicating circuit 805R is implemented with a transistor TB2. As illustrated, transistor TB2 is an NMOS transistor, but other transistor types may alternatively be employed. To improve clarity, the current bias transistor TB of FIG. 10 has been relabeled as transistor TB1 in FIG. 11.

Another different exemplary feature in FIG. 11 is that the components and the current of CM replicating circuit 805R are scalable. Specifically, the components and the current thereof are scaled by a factor of "k", where k equals a natural number such as 1, 2, 3, 4 . . . n. Scaling the components and the current can save power. Also, scaling down the size of the transistor devices can save surface area of the IC.

The component and current values of FIG. 11 are indicated parenthetically near the relevant circuit element. For example, the resistance value of resistive elements R1 and R2 are indicated as "(R)", and the current strength of transistor TB1 is indicated as "(I)". The widths "W" and lengths "L" of the illustrated transistor devices are indicated as width-length quotients (W/L), which may be referred to as the "aspect ratios" of the transistors. Specifically, transistor T3 is indicated as "(W1/L1)", and transistor TB1 is indicated as "($W_2/L_2$)".

The scaling analysis for CM replicating circuit 805R is started using Eqn. 1 as provided above with reference to FIG. 5:

$$V_{CM} = V_{TT} - (I) \cdot R - \left(\frac{I}{2}\right) \cdot (R_1 \text{ or } R_2). \quad \text{(Eqn. 1)}$$

This equation is then modified in two places to produce Eqn. 2 that reflects the resistive elements of FIG. 11. First, the transistor T4 implementation of the resistive element that corresponds to resistive element R is noted with a subscript. Second, the resistive element R7 that corresponds to resistive element R1 or R2 is substituted:

$$V_{CM} = V_{TT} - (I) \cdot R_{T4} - \left(\frac{I}{2}\right) \cdot R_7. \quad \text{(Eqn. 2)}$$

The middle portion of Eqn. 2 is then modified so as to equalize the current terms in the middle and third portions to arrive at Eqn. 3:

$$V_{CM} = V_{TT} - \left(\frac{I}{2}\right) \cdot 2 \cdot R_{T4} - \left(\frac{I}{2}\right) \cdot R_7. \quad \text{(Eqn. 3)}$$

The scaling factor k is then applied to Eqn. 3 to create Eqn. 4:

$$V_{CM} = V_{TT} - \left(\frac{I}{2k}\right) \cdot 2k \cdot R_{T4} - \left(\frac{I}{2k}\right) \cdot k \cdot R_7. \quad \text{(Eqn. 4)}$$

By comparing Eqn. 4 to Eqns. 1 and 2, it is apparent that the current for the CM replicating circuit 805R of FIG. 11 is reduced by a factor of "½k". Similarly, the width-length quotient, or aspect ratio, of the transistor device T4 (and thus that of transistor TB2) is also reduced by a factor of "½k", but the current density remains the same. Consequently, transistors T4 and TB2 are unchanged from a voltage point of view. The resistance value of resistive element R7, on the other hand, is increased by a factor of "k" in order to maintain the same voltage characteristics given the scaled-down current.

As illustrated, the resistance value of resistive element R7 is indicated as "(R*k)", and the current strength of transistor TB2 is indicated as "(½k)". With respect to the transistor aspect ratios, transistor T4 is indicated as "($W_1/(2k*L_1)$)", and transistor TB2 is indicated as "($W_2/(2k*L_2)$)". In this manner, both the power consumed by and the surface area occupied by CM replicating circuit 805R in the feedback circuit of FIG. 11 may be changed (i.e., reduced or increased) through application of a scaling factor.

Various aspects of the subject-matter described herein are set out for example and without limitation in the following numbered clauses:

1. An apparatus comprising:
an output circuit that is adapted to drive signals according to a first mode and a second mode, the output circuit including at least one input adapted to receive a mode select input, the mode select input capable of selecting between the first mode and the second mode;
wherein the first mode comprises a current mode logic (CML) signaling operation type and the second mode comprises a low voltage differential signaling (LVDS) operation type.

2. The apparatus as recited in clause 1, wherein the apparatus comprises at least one of an integrated circuit (IC) portion, an IC chip, and a printed circuit board (PCB).

3. The apparatus as recited in clause 1, wherein the apparatus comprises at least one integrated circuit (IC) memory chip.

4. The apparatus as recited in clause 1, wherein the output circuit is further adapted to switch from being capable of driving signals according to the second mode to being capable of driving signals according to the first mode by shorting a resistive element.

5. The apparatus as recited in clause 1, wherein the output circuit includes a pair of output transistors that are jointly usable for outputting CML signaling for the first mode and LVDS signaling for the second mode.

6. The apparatus as recited in clause 1, wherein the LVDS operation type of the second mode comprises a quasi-LVDS operation that provides a common mode voltage in accordance with at least one preference of a receiving unit.

7. The apparatus as recited in clause 1, wherein the CML signaling operation type of the first mode involves maintaining a predetermined output impedance using an alternating current (AC) ground that is capable of being created at a node between a resistive element and a capacitive element that are connected in series, with the capacitive element coupled to a ground potential.

8. An apparatus comprising:
a differential amplifier pair including first and second transistors and first and second loading resistive elements; the first transistor connected in series with the first loading resistive element and the second transistor connected in series with the second loading resistive element, the first transistor and the first loading resistive element connected in parallel with the second transistor and the second loading resistive element at an upper node and a lower node;
a first output driver input located at a gate terminal of the first transistor;
a second output driver input located at a gate terminal of the second transistor;
a first output driver output node located between the first transistor and the first loading resistive element;
a second output driver output node located between the second transistor and the second loading resistive element;
a resistive element coupled to the upper node; and
a switch having an open position and a closed position, the switch coupled to the upper
node and connected in parallel with the resistive element, the switch capable of shorting the resistive element when in the closed position;
wherein a first output driver mode is enabled when the switch is in the closed position and a second output driver mode is enabled when the switch is in the open position.

9. The apparatus as recited in clause 8, wherein the first output driver mode corresponds to a current mode logic (CML) signaling operation and the second output driver mode corresponds to a low voltage differential signaling (LVDS) operation.

10. The apparatus as recited in clause 8, wherein the first output driver mode is adapted for use with an alternating current (AC) coupling and the second output driver mode is adapted for use with a direct current (DC) coupling at the first and second output driver output nodes.

11. The apparatus as recited in clause 8, wherein the resistive element comprises a variable resistive element having a resistance value; and wherein the apparatus further comprises:
a feedback mechanism that adjusts the resistance value to maintain a common mode voltage at the first output driver output node and the second output driver output node responsive to a selected reference voltage.

12. The apparatus as recited in clause 8, wherein the apparatus comprises a memory controller.

13. The apparatus as recited in clause 8, further comprising:
a current bias that is capable of establishing a current through at least one of the first and second transistors, the current bias coupled to the lower node and a common potential of the apparatus.

14. The apparatus as recited in clause 8, wherein the resistive element and the switch are also coupled to a supply voltage of the apparatus.

15. The apparatus as recited in clause 8, further comprising:
a capacitive element that is coupled to the upper node and a common potential of the apparatus.

16. An apparatus comprising:
an output driver circuit that is adapted to drive signals according to a first mode and a second mode, the output driver circuit including a first transistor connected in series with a first loading resistive element at a first output node and a second transistor connected in series with a second loading resistive element at a second output node;
wherein the first and second output nodes are jointly capable of driving signals according to the first mode or according to the second mode as determined by whether a resistive element that is coupled to the output driver circuit is shorted or is not shorted, respectively.

17. The apparatus as recited in clause 16, wherein the output driver circuit is capable of driving differential signals.

18. The apparatus as recited in clause 16, wherein the first mode comports with a current mode logic (CML) signaling type and the second mode comports with a low voltage differential signaling (LVDS) type.

19. An apparatus comprising:
a differential amplifier pair including first and second transistors and first and second is loading resistive elements; the first transistor connected in series with the first loading resistive element and the second transistor connected in series with the second loading resistive element, the first transistor and the first loading resistive element connected in parallel with the second transistor and the second loading resistive element at an upper node and a lower node;
a first output driver input located at a gate terminal of the first transistor;
a second output driver input located at a gate terminal of the second transistor;
a first output driver output node located between the first transistor and the first loading resistive element;
a second output driver output node located between the second transistor and the second loading resistive element;
a resistive element coupled to the upper node; and
a mode selection component that enables the apparatus to switch from being capable of driving signals at the first and second output driver output nodes according to a first mode to being capable of driving signals at the first and second output driver output nodes according to a second mode, and vice versa.

20. The apparatus as recited in clause 19, wherein the mode selection component comprises a mode select input; and wherein the first mode is adapted to operate with current mode logic (CML) signaling and the second mode is adapted to operate with low voltage differential signaling (LVDS).

21. The apparatus as recited in clause 19, wherein the mode selection component comprises a switch that is capable of opening and closing, the switch coupled to the upper node and connected in parallel with the resistive element; wherein the first mode results from the switch opening and the second mode results from the switch closing.

22. A method for operating an output driver in accordance with at least two modes, the method comprising:
receiving a mode select input at an output driver circuit;
selecting an output driver circuit configuration corresponding to at least one of a first operational mode and a second operational mode responsive to the received mode select input, the output driver circuit including a differential pair that provides differential outputs for the output driver circuit; and
driving the output driver circuit at the differential outputs according to at least one of the first operational mode and the second operational mode based on the selected output driver circuit configuration, the first operational mode corresponding to current mode logic (CML) signaling and the second operational mode corresponding to low voltage differential signaling (LVDS).

23. A method for operating an output driver in accordance with at least two modes, the method comprising:
receiving a mode select input at an output driver circuit;
if the mode select input comprises a first value, activating a switch into an open position; wherein the switch is connected in parallel with a resistive element and coupled between a supply voltage and an alternating current (AC) ground;
if the mode select input comprises a second value, activating the switch into a closed position;
if the switch is in the open position, driving the output driver circuit according to a first mode; and
if the switch is in the closed position, driving the output driver circuit according to a second mode.

24. The method as recited in clause 23, further comprising:
changing a common mode voltage at differential outputs of the output driver circuit for the first mode by adjusting a resistance value of the resistive element that is connected in parallel with the switch.

25. The method as recited in clause 23, further comprising:
establishing a bias current using a transistor that is connected in series with a differential pair of amplifiers.

26. The method as recited in clause 23, wherein the first mode comprises a low voltage differential signaling (LVDS) format and the second mode comprises a current mode logic (CML) signaling format.

27. An integrated circuit (IC) chip comprising:
a voltage supply;
a common potential;
a first resistive element connected in series with a first transistor that are coupled between an upper node and a lower node;
a second resistive element connected in series with a second transistor that are coupled between the upper node and the lower node;
a third resistive element coupled between the voltage supply and the upper node; and
a third transistor coupled between the lower node and the common potential.

28. The IC chip as recited in clause 27, wherein the first resistive element, the first transistor, the second resistive element, the second transistor, the third resistive element, and the third transistor comprise at least part of a quasi-low voltage differential signaling (LVDS) type output driver.

29. The IC chip as recited in clause 27, wherein the first resistive element, the first transistor, the second resistive element, the second transistor, the third resistive element, and the third transistor comprise at least part of an output driver; and
wherein the output driver comprises:
a first input located at a gate terminal of the first transistor;
a second input located at a gate terminal of the second transistor;
a first output node located between the first transistor and the first resistive element; and
a second output node located between the second transistor and the second resistive element.

30. The IC chip as recited in clause 27, further comprising:
a capacitive element coupled between the upper node and the common potential.

31. The IC chip as recited in clause 27, wherein the third transistor is adapted to establish a current strength to flow through at least one of (i) the first resistive element and the first transistor and (ii) the second resistive element and the second transistor.

32. The IC chip as recited in clause 27, wherein the first resistive element has a first resistance value and the second resistive element has a second resistance value; and wherein the first resistance value is approximately equal to the second resistance value.

33. The IC chip as recited in clause 27, wherein the third resistive element comprises an adjustable resistive element.

34. The IC chip as recited in clause 33, wherein the adjustable resistive element comprises a variable resistive element.

35. The IC chip as recited in clause 34, wherein the variable resistive element comprises a positive-channel metal oxide semiconductor (PMOS) transistor.

36. The IC chip as recited in clause 27, wherein the first transistor and the second transistor comprise negative-channel metal oxide semiconductor (NMOS) transistors.

37. An apparatus comprising:
a differential amplifier circuit that includes first and second inputs and first and second outputs, the differential amplifier circuit capable of amplifying differential signals propagating from the first and second inputs to the first and second outputs;
a variable resistive element coupled to a supply voltage of the apparatus; and
a current bias source coupled to a common potential of the apparatus, the current bias source capable of establishing a current strength that flows through the variable resistive element and at least part of the differential amplifier circuit;
wherein the variable resistive element, the differential amplifier circuit, and the current bias source are connected in series between the supply voltage and the common potential.

38. The apparatus as recited in clause 37, wherein the current bias source comprises a transistor.

39. The apparatus as recited in clause 37, further comprising:
a capacitive element, which is adapted to create an alternating current (AC) ground, coupled to a node between the variable resistive element and the differential amplifier circuit.

40. The apparatus as recited in clause 37, wherein a resistance value of the variable resistive element changes responsive to changes in the current strength established by the current bias source.
41. The apparatus as recited in clause 37, wherein a resistance value of the variable resistive element is caused by a feedback mechanism to vary inversely with changes to the current strength that is established by the current bias source.
42. The apparatus as recited in clause 37, wherein a common mode voltage at the first and second outputs of the differential amplifier circuit changes with changes to the current strength as established by the current bias source absent concomitant changes to a resistance value of the variable resistive element.
43. The apparatus as recited in clause 37, wherein the differential amplifier circuit comprises:
a first resistive element coupled to a first node and a second node;
a first transistor coupled to the second node and a third node;
a second resistive element coupled to the first node and a fourth node; and
a second transistor coupled to the fourth node and the third node;
wherein the first input is located at a gate terminal of the first transistor, the first output is located at the second node, the second input is located at a gate terminal of the second transistor, and the second output is located at the fourth node; and
wherein the variable resistive element is coupled between the supply voltage and the first node, and the current bias source is coupled between the third node and the common potential.
44. The apparatus as recited in clause 37, wherein the apparatus comprises at least one of an integrated circuit (IC) portion, an IC chip, and a printed circuit board (PCB).
45. The apparatus as recited in clause 37, wherein the apparatus comprises at least one integrated circuit (IC) memory chip.
46. The apparatus as recited in clause 37, wherein the apparatus comprises a quasi-low voltage differential signaling (LVDS) output driver.
47. An arrangement comprising:
amplification means for amplifying differential signals for transmission from first and second output nodes of an output driver;
resistance means for providing a resistance between the amplification means and a supply voltage; and
switching means for shorting the resistance means, the switching means adapted to enable a first output driver mode when the resistance means is shorted and to enable a second output driver mode when the resistance means is not shorted.
48. The arrangement as recited in clause 47, wherein the first output driver mode corresponds to a current mode logic (CML) signaling operation and the second output driver mode corresponds to a low voltage differential signaling (LVDS) operation.
49. The arrangement as recited in clause 47, wherein the resistance means comprises a variable resistance means for providing a variable resistance between the amplification means and the supply voltage.

Although details of specific implementations and embodiments are described above, such details are intended to satisfy statutory disclosure obligations rather than to limit the scope of the following claims. Thus, the invention as defined by the claims is not limited to the specific features described above. Rather, the invention is claimed in any of its forms or modifications that fall within the proper scope of the appended claims, appropriately interpreted in accordance with the doctrine of equivalents.

What is claimed is:
1. An apparatus comprising:
an output driver circuit; the output driver circuit including a variable resistive element, a programmable current source, and differential signaling outputs; the output driver circuit associated with a common mode voltage at the differential signaling outputs; wherein the common mode voltage changes when a current established by the programmable current source changes; and
a feedback mechanism including a common mode voltage replicating circuit to determine the common mode voltage, the feedback mechanism adapted to ascertain a feedback signal based on the determined common mode voltage and a reference voltage, the feedback mechanism further adapted to provide the feedback signal to the variable resistive element of the output driver circuit;
wherein the feedback signal adjusts a resistance value of the variable resistive element, which adjusts the common mode voltage.
2. The apparatus as recited in claim 1, wherein the feedback mechanism includes a common mode voltage sensing circuit to determine the common mode voltage.
3. The apparatus as recited in claim 1, wherein the feedback mechanism includes a common mode voltage feedback circuit to ascertain the feedback signal based on a difference between the determined common mode voltage and the reference voltage, the common mode voltage feedback circuit adapted to forward the feedback signal to the variable resistive element.
4. The apparatus as recited in claim 1, wherein the variable resistive element comprises a transistor in which a resistance value thereof is adjustable by changing a voltage applied to a gate of the transistor in order to effectuate a voltage compensation feature for the apparatus.
5. The apparatus as recited in claim 1, wherein the output driver circuit includes a differential amplifier that includes the differential signaling outputs; and wherein the variable resistive element, the differential amplifier, and the programmable current source are connected in series.
6. An apparatus comprising:
a differential amplifier pair including first and second transistors and first and second loading resistive elements; the first transistor connected in series with the first loading resistive element and the second transistor connected in series with the second loading resistive element, the first transistor and the first loading resistive element connected in parallel with the second transistor and the second loading resistive element at an upper node and at a lower node;
a first signal driver input located at a gate of the first transistor;
a second signal driver input located at a gate of the second transistor;
a first signal driver output located between the first transistor and the first loading resistive element;
a second signal driver output located between the second transistor and the second loading resistive element, the first signal driver output and the second signal driver output having a common mode voltage jointly associated therewith;
a variable resistive element coupled to the upper node, the variable resistive element including a resistance value input that is capable of adjusting a resistance value of the variable resistive element;

a programmable current source coupled to the lower node;
a common mode voltage determining circuit that is configured to determine the common mode voltage at the first signal driver output and the second signal driver output; and
a common mode voltage feedback circuit that is configured to accept as input the determined common mode voltage and a reference voltage and that produces as output a feedback signal;
wherein the feedback signal is capable of being provided to the resistance value input of the variable resistive element.

7. The apparatus as recited in claim 6, further comprising:
a switch having an opened position and a closed position, the switch coupled to the upper node and connected in parallel with the variable resistive element, the switch capable of shorting the variable resistive element when in the closed position;
wherein a first signal driver mode is enabled when the switch is in the closed position and a second signal driver mode is enabled when the switch is in the opened position.

8. The apparatus as recited in claim 7, wherein the first signal driver mode corresponds to a current mode logic (CML) signaling operation and the second signal driver mode corresponds to a low voltage differential signaling (LVDS) operation.

9. The apparatus as recited in claim 6, wherein the apparatus is capable of transmitting differential signals from the first signal driver output and the second signal driver output.

10. The apparatus as recited in claim 6, further comprising:
a capacitive element coupled between the upper node and a common potential of the apparatus, the capacitive element capable of creating an alternating current (AC) short between the upper nodes and the common potential.

11. The apparatus as recited in claim 10, wherein the common potential comprises a ground voltage level.

12. The apparatus as recited in claim 6, wherein the programmable current source is further coupled between the lower node and a common potential of the apparatus, the programmable current source comprising a transistor that is capable of biasing a current along a channel of the transistor responsive to a voltage applied to a gate of the transistor.

13. The apparatus as recited in claim 6, wherein the variable resistive element comprises a positive-channel metal oxide semiconductor (PMOS) transistor, a gate terminal of the PMOS transistor comprising the resistance value input.

14. The apparatus as recited in claim 6, wherein the variable resistive element is further coupled between the upper node and a supply voltage of the apparatus.

15. The apparatus as recited in claim 6, wherein the common mode voltage determining circuit comprises a common mode voltage sensing circuit that is adapted to sense the common mode voltage from the first signal driver output and the second signal driver output.

16. The apparatus as recited in claim 15, wherein the common mode voltage sensing circuit comprises a pair of resistive elements that are connected in series between the first signal driver output and the second signal driver output, the common mode voltage sensing circuit capable of producing the determined common mode voltage at a node between the pair of resistive elements.

17. The apparatus as recited in claim 6, wherein the common mode voltage determining circuit comprises a common mode voltage replicating circuit that is adapted to replicate the common mode voltage using a plurality of replicated components.

18. The apparatus as recited in claim 17, wherein the plurality of replicated components comprises a plurality of scaled components.

19. The apparatus as recited in claim 17, wherein the common mode voltage replicating circuit is adapted to use a scaled down current to produce the determined common mode voltage.

20. The apparatus as recited in claim 17, wherein the plurality of replicated components comprise a replicated variable resistive element, a replicated resistive element, a replicated transistor, and a replicated programmable current source; and wherein the replicated variable resistive element is coupled to a replicated upper node, the replicated resistive element is coupled between the replicated upper node and a replicated common mode voltage node, the replicated transistor is coupled between the replicated common mode voltage node and a replicated lower node, and the replicated programmable current source is coupled to the replicated lower node.

21. The apparatus as recited in claim 20, wherein the common mode voltage replicating circuit is capable of producing the determined common mode voltage at the replicated common mode voltage node.

22. The apparatus as recited in claim 20, wherein the feedback signal produced by the common mode voltage feedback circuit is also capable of being provided to a resistance value input of the replicated variable resistance element of the common mode voltage replicating circuit.

23. The apparatus as recited in claim 6, wherein the common mode voltage feedback circuit comprises a differential amplifier; and wherein the common mode voltage feedback circuit is adapted to ascertain the feedback signal, at least partially, by determining a difference between the determined common mode voltage and the reference voltage using the differential amplifier.

24. An arrangement comprising:
amplification means for amplifying differential signals for transmission from first and second output nodes of an output driver, the first and second output nodes associated with a common mode voltage;
variable resistance means for providing a variable resistance, the variable resistance means coupled to the amplification means;
programmable current means for providing a programmable current, the programmable current means coupled to the amplification means; the common mode voltage changing when the programmable current means changes;
determination means for determining the common mode voltage associated with the first and second output nodes comprising replication means for replicating the common mode voltage associated with the first and second output nodes; and
feedback means for providing a feedback signal to the variable resistance means, the feedback means using the determined common mode voltage and a reference voltage to provide the feedback signal;
wherein the variable resistance of the variable resistance means is capable of being varied responsive to the feedback signal and the variable resistance adjusts the common mode voltage.

\* \* \* \* \*